United States Patent
Hadar et al.

(10) Patent No.: US 8,415,552 B2
(45) Date of Patent: *Apr. 9, 2013

(54) SYSTEMS AND METHODS FOR PREVENTION OF OPEN LOOP DAMAGE DURING OR IMMEDIATELY AFTER MANUFACTURING

(75) Inventors: Ron Hadar, Cupertino, CA (US); Shmuel Arditi, Los Gatos, CA (US); Dan Kikinis, Saratoga, CA (US)

(73) Assignee: Tigo Energy, Inc., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/232,887

(22) Filed: Sep. 14, 2011

(65) Prior Publication Data

US 2012/0000515 A1    Jan. 5, 2012

Related U.S. Application Data

(63) Continuation of application No. 12/542,632, filed on Aug. 17, 2009, now Pat. No. 8,039,730.

(60) Provisional application No. 61/269,007, filed on Jun. 18, 2009.

(51) Int. Cl.
*H01L 25/00* (2006.01)

(52) U.S. Cl. .......................... 136/243; 327/214; 136/293

(58) Field of Classification Search .................. 136/293; 327/214

See application file for complete search history.

(56) References Cited

U.S. PATENT DOCUMENTS

| | | | |
|---|---|---|---|
| 4,470,213 A | 9/1984 | Thompson |
| 5,235,266 A | 8/1993 | Schaffrin |
| 5,268,832 A | 12/1993 | Kandatsu |
| 5,580,395 A | 12/1996 | Yoshioka et al. |
| 5,604,430 A | 2/1997 | Decker et al. |
| 5,923,158 A | 7/1999 | Kurokami et al. |
| 6,275,016 B1 | 8/2001 | Ivanov |
| 6,316,716 B1 | 11/2001 | Hilgrath |
| 6,331,670 B2 | 12/2001 | Takehara et al. |
| 6,448,489 B2 | 9/2002 | Kimura et al. |
| 6,650,031 B1 | 11/2003 | Goldack |
| 6,844,739 B2 | 1/2005 | Kasai et al. |
| 6,894,911 B2 | 5/2005 | Telefus et al. |
| 6,984,970 B2 | 1/2006 | Capel |

(Continued)

FOREIGN PATENT DOCUMENTS

| | | |
|---|---|---|
| AU | 2005262278 | 7/2005 |
| DE | 4232356 | 3/1994 |

(Continued)

OTHER PUBLICATIONS

Alonso, R. et al., "A New Distributed Converter Interface for PV Panels," 20th European Photovoltaic Solar Energy Conference, Barcelona, Spain, pp. 2288-2291, Jun. 6-10, 2005.

(Continued)

*Primary Examiner* — Miriam Berdichevsky
(74) *Attorney, Agent, or Firm* — Greenberg Traurig, LLP

(57) ABSTRACT

A solar cell having an open loop voltage that approaches a critical voltage range when exposed to light. A circuit, connected to the solar cell, is configured to load the solar cell when the open loop voltage of the solar cell reaches a threshold within a predetermined range of the critical voltage range.

20 Claims, 6 Drawing Sheets

U.S. PATENT DOCUMENTS

| | | | |
|---|---|---|---|
| 7,061,214 | B2 | 6/2006 | Mayega |
| 7,248,946 | B2 | 7/2007 | Bashaw et al. |
| 7,256,566 | B2 | 8/2007 | Bhavaraju et al. |
| 7,276,886 | B2 | 10/2007 | Kinder |
| 7,518,346 | B2 | 4/2009 | Prexl |
| 7,595,616 | B2 | 9/2009 | Prexl |
| 7,605,498 | B2 | 10/2009 | Ledenev et al. |
| 7,719,140 | B2 | 5/2010 | Ledenev et al. |
| 2001/0032664 | A1* | 10/2001 | Takehara et al. ............. 136/244 |
| 2002/0162585 | A1 | 11/2002 | Sugawara et al. |
| 2005/0057214 | A1 | 3/2005 | Matan |
| 2005/0057215 | A1 | 3/2005 | Matan |
| 2006/0001406 | A1 | 1/2006 | Matan |
| 2006/0174939 | A1 | 8/2006 | Matan |
| 2006/0185727 | A1 | 8/2006 | Matan |
| 2007/0273351 | A1 | 11/2007 | Matan |
| 2008/0121272 | A1 | 5/2008 | Besser et al. |
| 2008/0122449 | A1 | 5/2008 | Besser et al. |
| 2008/0122518 | A1 | 5/2008 | Besser et al. |
| 2008/0179949 | A1 | 7/2008 | Besser et al. |
| 2008/0191560 | A1 | 8/2008 | Besser et al. |
| 2008/0191675 | A1 | 8/2008 | Besser et al. |
| 2008/0303503 | A1 | 12/2008 | Wolfs |
| 2009/0289594 | A1 | 11/2009 | Sato |
| 2010/0139732 | A1 | 6/2010 | Hadar et al. |

FOREIGN PATENT DOCUMENTS

| | | |
|---|---|---|
| DE | 19961705 | 7/2001 |
| EP | 1388774 | 2/2004 |
| ES | 2249147 | 3/2006 |
| WO | 03012569 | 2/2003 |

OTHER PUBLICATIONS

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Basso, Tim, "IEEE Standard for Interrconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Enslin, Johan H.R., et al., "Integrated Photovoltaic Maximum Power Point Tracking Converter," IEEE Transactions on Industrial Electronices, vol. 44, No. 6, pp. 769-773, Dec. 1997.

Gautam, Nalin K. et al., "An Efficient Algorithm to Simulate the Electrical Performance of Solar Photovoltaic Arrays," Energy, vol. 27, No. 4, pp. 347-361, 2002.

International Patent Application No. PCT/US2009/054774, International Search Report & Written Opinion, Jul. 6, 2010.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

Quaschning, V. et al., "Cost Effectiveness of Shadow Tolerant Photovoltaic Systems," Euronsun 96, pp. 819-824, Sep. 16, 1996.

Roman, Eduardo, et al., "Intelligent PV Module for Grid-Connectred PV Systems," IEEE Transactions on Industrial Electronics, vol. 53, No. 4, pp. 1066-1073, Aug. 2006.

Uriarte, S. et al., "Energy Integrated Management System for PV Applications," 20th European Photovoltaic Solar Energy Conference, Jun. 6, 2005.

Walker, G. R. et al., "Cascaded DC-DC Converter Connection of Photovoltaic Modules," 33rd IEEE Power Electronics Specialists Conference (PESC'02), vol. 1, pp. 24-29, 2002.

Walker, Geoffrey R. et al., "Cascaded DC-DC Converter Connection of Photovoltaic Modules," IEEE Transactions on Power Electronics, vol. 19, No. 4, pp. 1130-1139, Jul. 2004.

* cited by examiner

SYSTEMS AND METHODS FOR PREVENTION OF OPEN LOOP DAMAGE DURING OR IMMEDIATELY AFTER MANUFACTURING

CROSS-REFERENCE TO RELATED APPLICATIONS

The present application is a continuation application of U.S. patent application Ser. No. 12/542,632, filed Aug. 17, 2009, which claims priority to U.S. Provisional Patent Application Ser. No. 61/269,007, filed Jun. 18, 2009, the disclosures of which applications are hereby incorporated herein by reference.

FIELD OF THE INVENTION

The present invention relates generally to the field of solar cells and, more particularly, to prevention of open loop damage during or immediately after manufacturing of solar cells.

BACKGROUND

With the increase in solar power installations and concurrent attention to their maintenance and life cycle, it has been found that solar cells, both monocrystalline (thin-film) and polycrystalline, wafers, and coated films, etc. can become structurally modified over time. This phenomena is typically referred to as "light induced degradation," and is sometimes referred to as the Staebler-Wronski effect. Light induced degradation has been discussed in various publications including, for example, Experimental Study of the Factors Governing the Staebler-Wronski Photodegradation Effect in a-Si:H Solar Cells, Annual Subcontract Report, 1 Apr. 1995-30 Jun. 1996 (October 1996) and National Staebler-Wronski Effect in Amorphous Silicon and Its Alloys, Opto-Electronics Review 12(1), 21-32 (2004).

It has been found that receiving a medium to large amount of light or sunlight with no load or very little load (referred to as "no load" herein) can physically damage solar cells and reduce the power output of the solar cells over their lifetime by 10% to 15% percent or more. Often, from the time solar cells leave a factory to the time when they are connected to the power grid, there is a loss of power of up to 20% per solar module. But even after such connection, damage may continue in the field due to open circuit conditions (VOC) in early morning hours and other factors.

The cause of light induced degradation is not very well understood currently. The problem often occurs during and immediately after manufacturing the solar cells. One possible effect of the problem is an undesirable buildup of unipolar or dipolar charges near the junction layer of the solar cell. The buildup, or static barrier, results in reduction of the solar cell output voltage by as much as 20%, depending on the prevalent mix of wavelengths and temperature to which the solar cells are exposed. Undesirable effects are compounded by the above-mentioned physical damage to the solar cell and can lead to very substantial losses in the production of electricity, as the static barrier reduces the energy output of the solar cell and further contributes to its heating up.

SUMMARY

In one of many embodiments of the present invention, systems and methods include a solar cell having an open loop voltage approaching a critical voltage range when exposed to light. A circuit, connected to the solar cell, is configured to load the solar cell when the open loop voltage of the solar cell reaches a threshold within a predetermined range of the critical voltage range.

Other embodiments and features of the present invention will be apparent from the accompanying drawings and from the detailed description which follows.

BRIEF DESCRIPTION OF THE DRAWINGS

The present disclosure is illustrated by way of example and not limitation in the figures of the accompanying drawings in which like references indicate similar elements.

DESCRIPTION OF THE EMBODIMENT

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Moreover, whether or not there is express reference to an "embodiment" or the like, various features are described which may be variously combined and included in some embodiments but also variously omitted in other embodiments. Similarly, various requirements are described which may be requirements for some embodiments but not other embodiments.

Figure 1B:
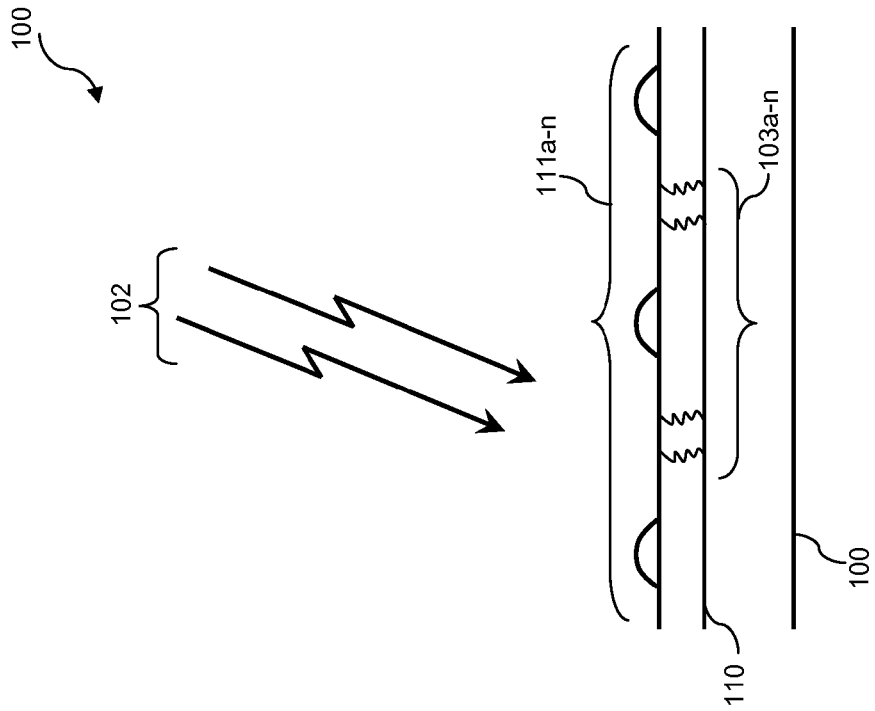
FIG. 1B illustrates an exemplary solar cell having micro-cracks.
Figure 1A:
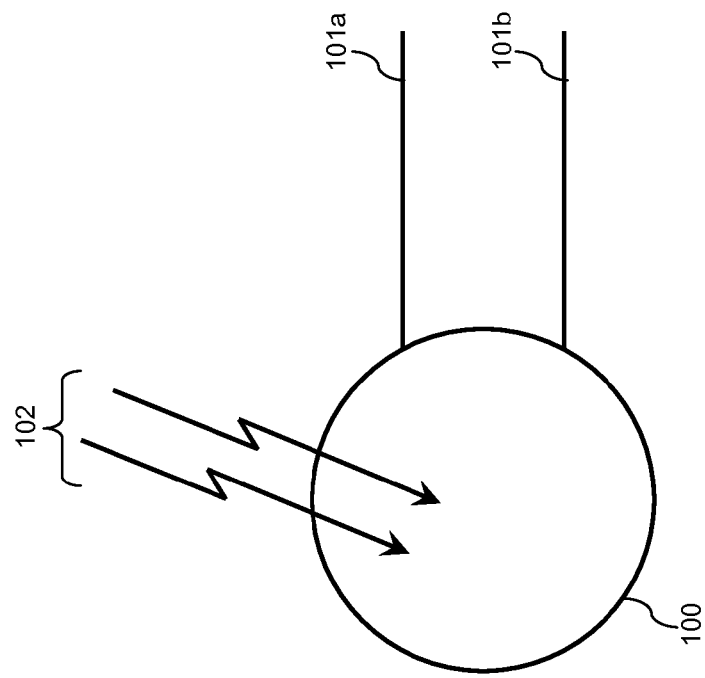
FIG. 1A illustrates an exemplary solar cell.

FIG. 1A shows an exemplary solar cell 100 having wire tails (leads) 101a and 101b used to connect to other solar cells (not shown). The solar cell 100 is exposed to a light source 102. As the light exposure on the solar cell 100 continues, it is currently hypothesized that, when the solar cell 100 is in a no-load situation, the voltage within the solar cell 100 can actually increase to a point where it exceeds the breakdown voltage of the p-n junction typically present in such cells. This condition can lead to damage of the solar cell 100, including but not limited to, for example, micro-cracks in the junction layer or structure. The presence of micro-cracks, in turn, leads to a permanent loss of energy by internal leakage in the solar cell 100. This leakage can also further heat up the solar cell 100, and thus even more reduce the efficiency of the solar cell 100.

FIG. 1B shows a cross section of the exemplary solar cell 100, typically a wafer, having at least one junction layer 110 in the middle of the solar cell structure 100. Wires 101a,b are connected to metallization pins 111a-n at the top of the wafer and to the bottom of the wafer. The light source 102 exposes light on the solar cell 100. The solar cell 100 includes micro-cracks or other physical phenomena including but not limited to electrons, natural holes, etc. 103a-n that have formed in the upper active layer and/or the junction layer 110, or both, of the solar cell 100. The aforementioned effects—including the micro-cracks, electrons, natural holes, etc.—will be collectively referred to as micro-cracks 103a-n herein.

It is thought that the formation of these micro-cracks 103a-n results from the solar cell voltage constantly exceeding its breakdown voltage, thus causing premature aging of the solar cell. Not shown in FIG. 1B is the possible buildup of a static barrier of unipolar or dipolar charges near the junction layer 110, resulting in reduction of the solar cell output voltage by as much as 20%, depending on the wavelengths and temperature to which the solar cell is exposed.

The present invention includes systems and methods to prevent the formation of the micro-cracks, as described above, both during and after the manufacture of a solar cell. As will be appreciated by those having ordinary skill in the art, the micro-cracks can form as early as the first few days in the life of a solar cell. Hence, the systems and methods of the present invention can be utilized or implemented in a production facility for manufacturing the solar cell to avoid such damage at the earliest possible point in the life of the solar cell. It is estimated that such timely utilization and application of the systems and methods of the present invention can result in approximately 10 to 15 percent more energy output from a solar cell over its lifetime.

Figure 2B:
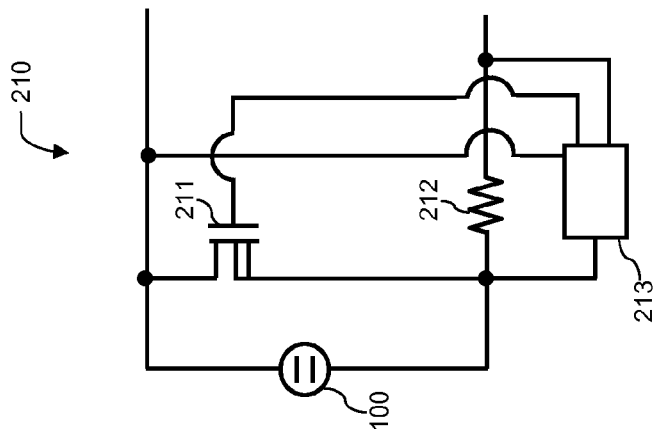
FIG. 2B illustrates a second exemplary circuit in accordance with one embodiment of the present invention.
Figure 2C:
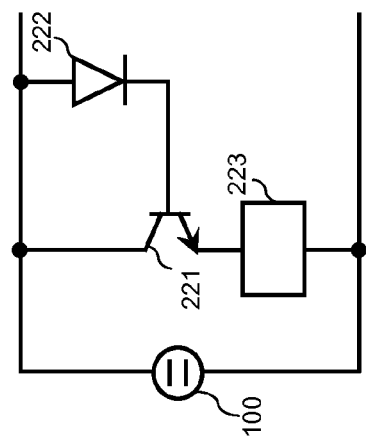
FIG. 2C illustrates a third exemplary circuit in accordance with one embodiment of the present invention.
Figure 2A:
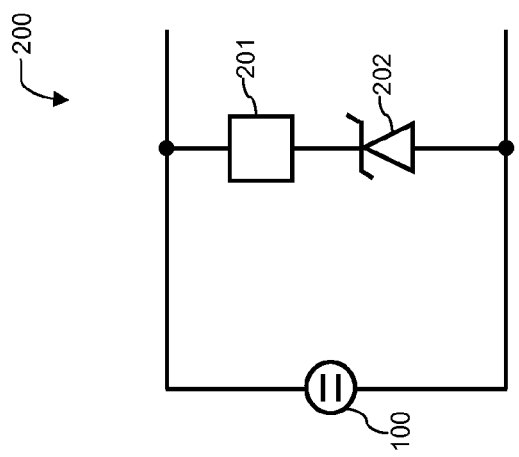
FIG. 2A illustrates a first exemplary circuit in accordance with one embodiment of the present invention.

FIGS. 2A-2C illustrate exemplary types of electric circuits that can be applied to the solar cell 100. FIG. 2A shows a simplified exemplary circuit 200 having a resistor 201 and a Zener diode 202.

Figure 4:
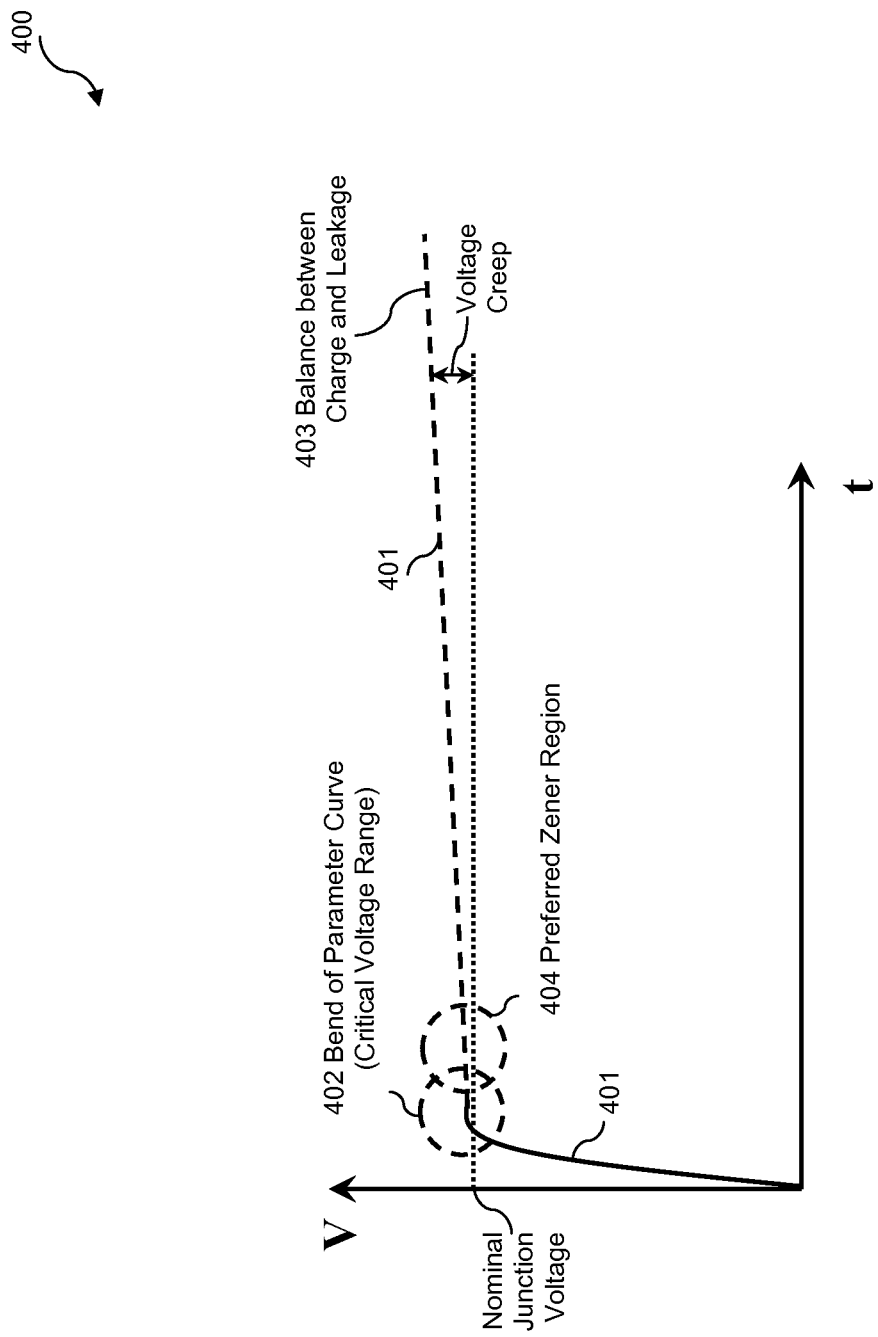
FIG. 4 is a graph illustrating a parameter curve in accordance with one embodiment of the present invention.

FIG. 4 is a graph 400 of a parameter curve 401 that illustrates the behavior of a typical solar cell in a no-load condition. A no-load condition can occur in many situations including, for example, during manufacture of the solar cell 100 and during emergency shut-off when a solar panel including the solar cell 100 is disconnected from a bus or grid. The x-axis represents time and the y-axis represents voltage of the solar cell 100. As light is exposed to the solar cell 100, the voltage will quickly increase and then initially stabilize at a nominal junction voltage at a bend 402. The bend 402 represents a critical voltage range after which the solar cell 100 can become damaged. A preferred Zener region 404 is a voltage range within which it is preferred to set the Zener voltage of clamping circuits to load the solar cell 100 so that damage to the solar cell 100 can be prevented. With sufficient light, the voltage of the solar cell 100 will slowly creep upwards beyond the nominal junction voltage and reach a maximum open loop voltage 403 reflecting a balance between charge and leakage.

Accordingly, the Zener diode 202 should be tuned so that the voltage of the solar cell 100 is not cut off too low in order to not waste energy and is not cut off too high in order to avoid damage to the solar cell 100. The preferred Zener region 404 (i.e., the breakdown voltage) should occur shortly after the curve 401 exceeds the nominal junction voltage after the bend 402. In one embodiment, the preferred Zener region 404 can be within a predetermined range of the critical voltage range or the nominal junction voltage. In operation, the Zener diode 202 is activated in the reverse direction only during open loop conditions. Once actual current is flowing in a non-open loop condition, the Zener diode 202 is not activated in the reverse direction.

Different solar cells have different open loop voltage characteristics, and each solar cell 100 will have a unique bend 402 and critical voltage range. Thus, in one embodiment, the Zener diode 202 can be laser trimmed or otherwise tuned by conventional techniques known by those having ordinary skill in the art to precisely and accurately match the characteristics of a particular solar cell.

FIG. 2B shows a simplified exemplary circuit 210 having an active controller 213 and a FET switch transistor 211. The transistor 211 is controlled by the active controller 213. In one embodiment, a load-measuring resistor 212 may be added. The resistor 212 could be, for example, a milliohm resistor providing just enough voltage drop to allow the circuitry of controller 213 to determine if a load (not shown) connected to the solar cell 100 is sufficient or not. When the load is sufficient, the voltage of the solar cell 100 can be ignored. In one embodiment, the controller 213 can be programmed with a preset threshold at the factory. When the load exceeds the preset threshold, the controller 213 turns off the transistor 211. In one embodiment, the controller 213 does not have to provide an accurate measurement of the load, but rather a rough range.

In one embodiment, the controller 213 could be an analog circuit measuring the open loop voltage and/or the load current and turning on or off one or more loads by turning on the transistor 211.

In one embodiment, the transistor 211 could be a transistor or switch other than a FET transistor.

In one embodiment, the transistor 211 could be replaced by one or more transistors in parallel.

In one embodiment, the transistor 211 may need additional cooling.

In one embodiment, the controller 213 can be implemented by using, for example, a programmable microcontroller and applying techniques well known in the art of industrial control.

In one embodiment, the controller 213 includes a circuit having one or more components than can be adjusted by a laser to accurately determine voltage thresholds, both in the case of analog circuits and/or microprocessors, etc. In one embodiment, during that process, a controlled sequence of lights can be used to irradiate the solar cell and measure voltages and other characteristics in a manner and at a level that avoids damaging the solar cell. In one embodiment, to avoid or reduce light sensitivity or sensitivity to other external factors, the controller 213 can be covered with a protective, passivating cover.

FIG. 2C shows a simplified exemplary circuit 220 having a bipolar junction transistor 221 with a current-limiting resistor 223 and a biasing diode 222. The transistor 221 and the diode 222 together function as a "poor-man's" Zener diode. The resistor 223 limits the maximum current. In one embodiment, the transistor 221 can be a transistor other than a pure bipolar junction transistor. In one embodiment, the diode 222 may be a standard diode. In one embodiment, the diode 222 can be a laser-trimmed diode or a Zener diode to ensure that the circuit 220 runs within a voltage range required to protect the solar cell 100. In one embodiment, as discussed above, the transistor 221 should be turned on when the voltage across the base and emitter of the transistor 221 and the diode 222 reaches the voltage at the bend 402 of the solar cell. In one embodiment, the transistor 221 can be trimmed so that the voltage across the base and emitter of the transistor 221, which turns on the transistor 221, is in the voltage range required to protect the solar cell 100. In one embodiment, the diode 222 is not used.

Figure 3:
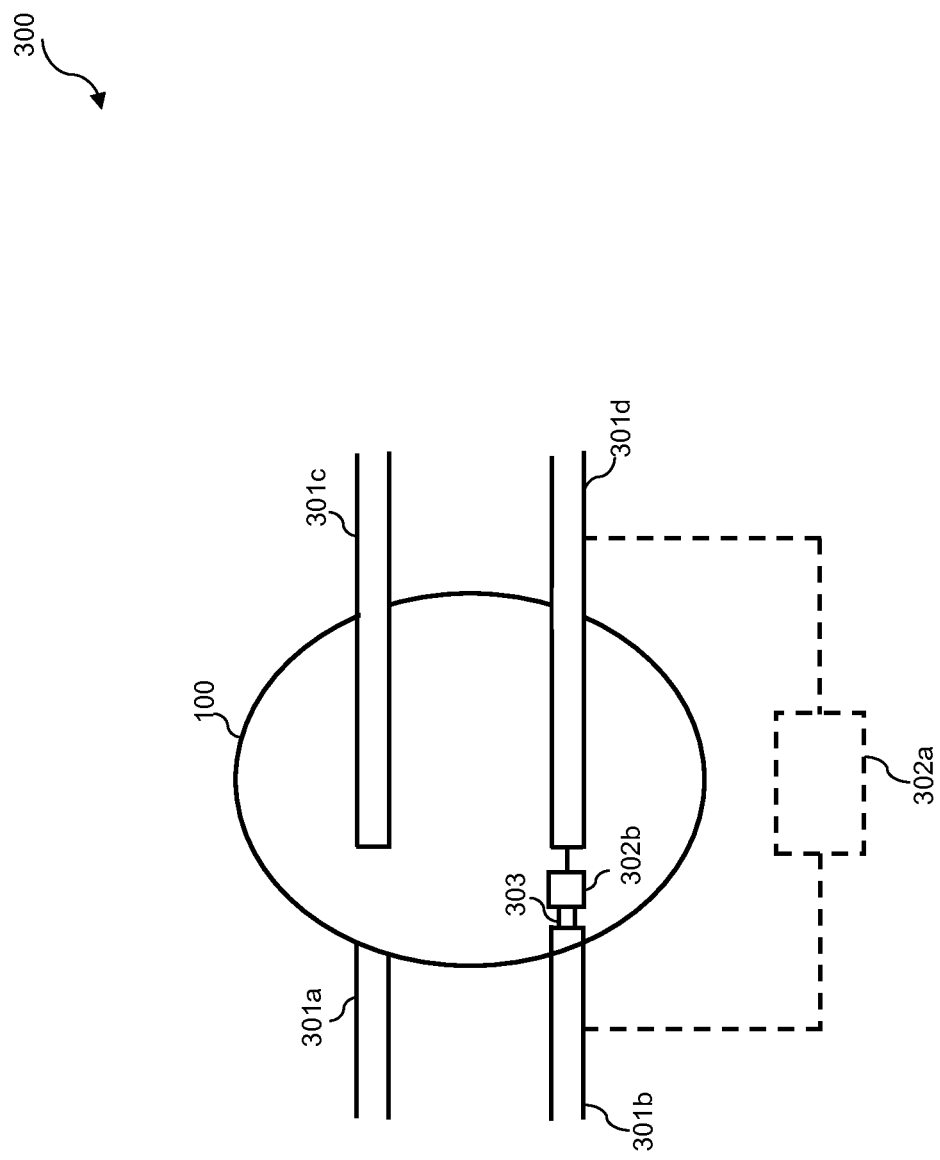
FIG. 3 illustrates a connection system for a solar cell in accordance with one embodiment of the present invention.

FIG. 3 shows a connection system 300 that connects the components of the circuits 200, 210, 220 as shown in FIGS. 2A-2C. In one embodiment, the connection system 300 can be assembled during a manufacturing process for solar cells. A solar cell, such as the solar cell 100, is typically connected to adjoining solar cells by means of metal strips in a daisy chain type of arrangement. As shown in FIG. 3, strips (leads) 301a and 301b come from an adjoining solar cell (not shown) on the left of the solar cell 100 and are attached to the bottom of the solar cell 100. Additional strips (leads) 301c and 301d connect in a similar manner from the metallization (top) layer of the solar cell 100 to the bottom of the next solar cell (not shown) on the right.

In one embodiment, the connection system 300 includes a circuit 302a that is connected externally to the solar cell 100. The circuit 302a can incorporate the components of the circuits 200, 210, 220 other than the solar cell 100. In one embodiment, components of a circuit equivalent to the circuits 200, 210, 220 can be incorporated into the circuit 302a.

In one embodiment, the connection system 300 includes a circuit 302b that can be integrated within the solar cell 100. The circuit 302b can incorporate the components of the circuits 200, 210, 220 other than the solar cell 100. In one embodiment, components of a circuit equivalent to the circuits 200, 210, 220 can be incorporated into the circuit 302b. The integration of the circuit 302b could require additional steps in the manufacturing process of the wafer, such as the creation of vias, which then could slightly increase its cost. However, this additional expense can be avoided by including a special metallization pad 303. The metallization pad 303 connects the incoming lead 301b from the bottom of the wafer to the top of the wafer, thus allowing the circuit 302b to be placed on the top layer of the wafer. The integration of the circuit 302b in the wafer allows, for example, embedding of a simplistic circuit, such as circuit 200, into the silicon or polysilicon of the wafer and performing the laser trimming of the Zener diode 201 with only one additional process.

This approach would not require additional metallization layers because it would use existing metallization in the wafer. However, this approach may require masking certain areas of the wafer during the diffusion step in the manufacture of the solar cell that is used to create the structures of the Zener diode. Although a small area of the wafer may become nonproductive; i.e., the area of the additional metallization pad 303 and the circuit 302b, this area typically would be less than one percent of the total area of the wafer. However, because the resulting additional energy production would be in the 10 to 15 percent range, this small expenditure of space is well justified.

In one embodiment, the circuit 302b is integrated in the solar cell 100 without the external connection of the circuit 302a.

In one embodiment, the circuit 302a is externally connected to the solar cell 100 without the integration of the circuit 302b in the solar cell 100.

In one embodiment, the circuit 302a and the circuit 302b both can be connected to the solar cell 100.

Figure 5:
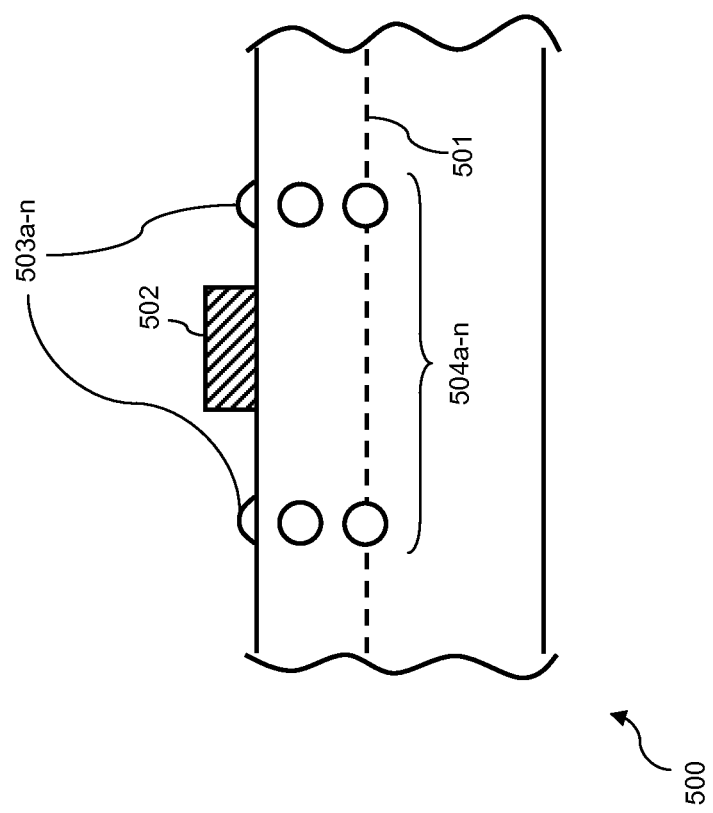
FIG. 5 illustrates a plurality of electrodes in a solar cell in accordance with one embodiment of the present invention.

FIG. 5 shows a simplified cross section 500 of the solar cell 100. The solar cell 100 includes a junction layer 501 and a main electrode 502. As stated above, an undesirable buildup of unipolar or dipolar charges can occur in the solar cell 100 that reduce the voltage that can be produced by the solar cell 100. The buildup of charges typically appears between or adjacent the junction layer 501 and the main electrode 502. The buildup can result in reduction of the solar cell output voltage by as much as 20%, depending on the mix of wavelengths and temperature to which the cells are exposed.

To address the buildup of charges, additional (auxiliary) topical electrodes 503a-n and additional (auxiliary) internal electrodes 504a-n can be formed in the solar cell 100. The topical electrodes 503a-n and the internal electrodes 504a-n can be used to inject very short pulses to remove those charges. In one embodiment, the topical electrodes 503a-n and the internal electrodes 504a-n can be very narrow, as only nominal currents have to flow to pulse away the built-up charge.

By monitoring the output voltage and temperature of a solar cell, the required time period between the pulses can be optimized to reduce losses through the pulses themselves.

In one embodiment, the pulses can be delivered through the main electrode 502.

In one embodiment, the pulses can be delivered through the topical electrodes 503a-n.

In one embodiment, the pulses can be delivered through the internal electrodes 504a-n.

In one embodiment, the pulses can be delivered through a combination of the main electrode 502, the topical electrodes 503a-n, and the internal electrodes 504a-n.

The delivered pulses can clear out clouds of unipolar or dipolar charges, which reduce the effective output voltage and thus the efficiency of the cells. In one embodiment, a simple circuit (not shown) external to the solar cell 100, in addition or combined with other circuits, can be used to generate those pulses. Alternatively, a circuit, which can produce very short pulses that short-circuit the solar cell, could clear out those clouds as well, and can be integrated in a solar panel or cell controllers.

Figure 6:
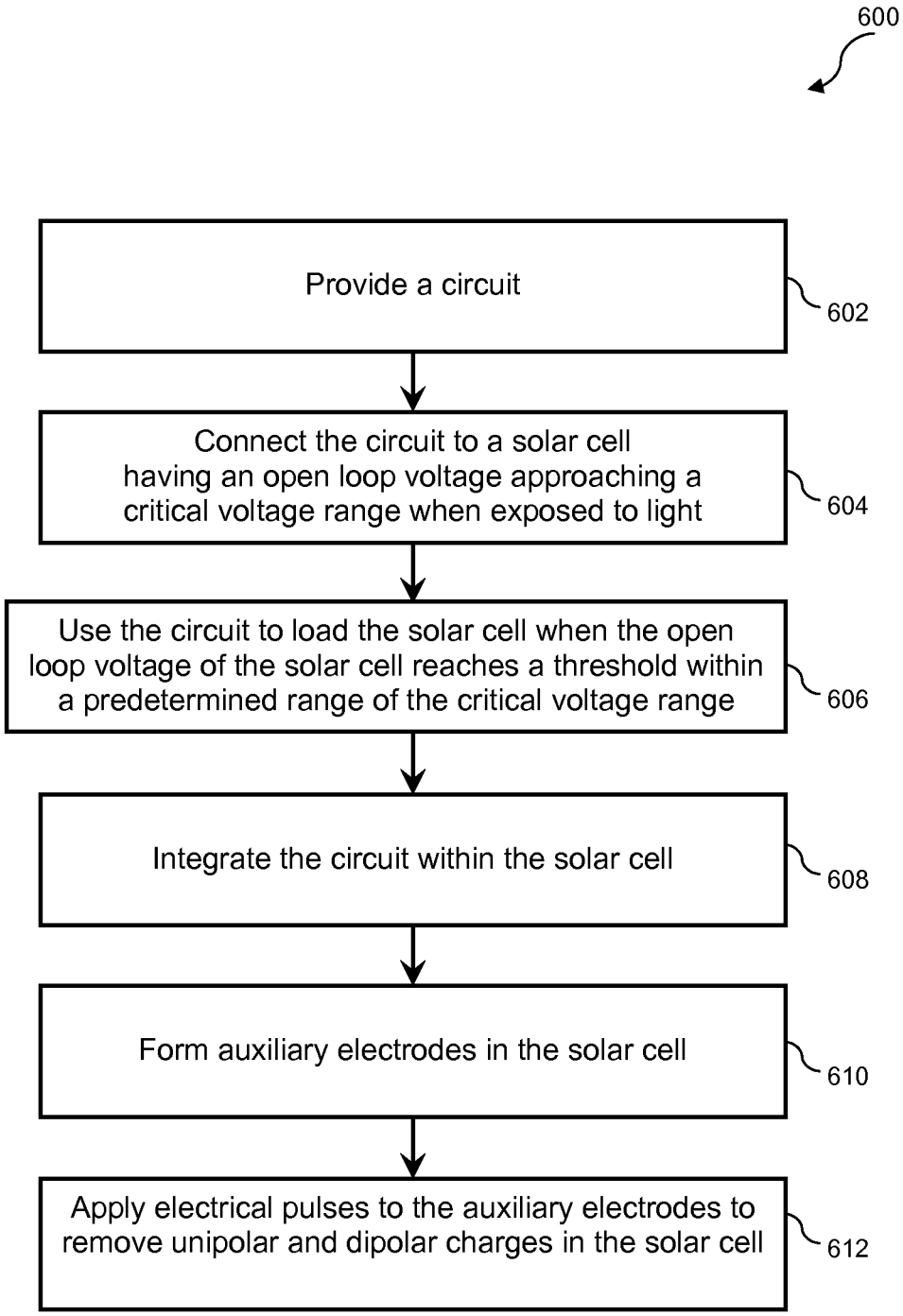
FIG. 6 illustrates an exemplary method in accordance with one embodiment of the present invention.

FIG. 6 shows a method 600 in accordance with one embodiment of the present invention. In step 602, a circuit is provided. In step 604, the circuit is connected to a solar cell having an open loop voltage approaching a critical voltage range when exposed to light. In step 606, the circuit is used to load the solar cell when the open loop voltage of the solar cell reaches a threshold within a predetermined range of the critical voltage range. In step 608, the circuit is integrated within the solar cell. In step 610, auxiliary electrodes are formed in the solar cell. In step 612, electrical pulses are applied to the auxiliary electrodes to remove unipolar and dipolar charges in the solar cell.

It is clear that many modifications and variations of this embodiment may be made by one skilled in the art without departing from the spirit of the novel art of this disclosure. These modifications and variations do not depart from the broader spirit and scope of the invention, and the examples cited here are to be regarded in an illustrative rather than a restrictive sense.

What is claimed is:

1. A solar energy generation system, comprising:
a solar cell to produce a voltage;
a circuit comprising an FET transistor, the circuit connected to the solar cell to load the solar cell when the voltage of the solar cell reaches a threshold; and
a controller, connected to the FET transistor, configured to turn off the FET transistor when the controller determines that a value of a load connected to the solar cell is more than a preset threshold.

2. The system of claim 1, wherein the controller can be programmed to store the preset threshold.

3. The system of claim 1, further comprising a resistor, connected to the controller, to indicate the value of the load.

4. The system of claim 1, wherein the controller is configured to measure the voltage of the solar cell.

5. The system of claim 4, wherein the controller is configured to measure the value of the load.

6. The system of claim 5, wherein the controller is configured to turn on the FET transistor according to the voltage of the solar cell when the value of the load connected to the solar cell is less than the preset threshold.

7. The system of claim 5, wherein the FET transistor is a first FET transistor; and the circuit further includes a second FET transistor connected in parallel with the first FET transistor.

8. The system of claim 5, wherein the controller includes a programmable microcontroller.

9. The system of claim 8, wherein the preset threshold is programmable via laser.

10. The system of claim 8, further comprising:
a protective cover mounted to cover the controller to reduce or eliminate light sensitivity.

11. A method, comprising:
providing a solar cell to produce a voltage;
providing a circuit comprising an FET transistor;
connecting the circuit to the solar cell to load the solar cell when the voltage of the solar cell reaches a first threshold; and
turning off, by a controller coupled with the FET transistor, the FET transistor when the controller determines that a value of a load connected to the solar cell is more than a second preset threshold.

12. The method of claim 11, further comprising programming the controller to store one of the first threshold and the second threshold.

13. The method of claim 11, further comprising providing a resistor, connected to the controller, to indicate the value of the load.

14. The method of claim 11, further comprising measuring, by the controller, the voltage of the solar cell.

15. The method of claim 14, further comprising measuring, by the controller, the value of the load.

16. The method of claim 15, further comprising turning on, by the controller, the FET transistor according to the voltage of the solar cell when the value of the load connected to the solar cell is less than the second threshold.

17. The method of claim 15, wherein the FET transistor is a first FET transistor; and the circuit further includes a second FET transistor connected in parallel with the first FET transistor.

18. The method of claim 15, wherein the controller includes a programmable microcontroller.

19. The method of claim 18, wherein the preset threshold is programmable via laser.

20. The method of claim 18, further comprising providing a cover over the controller to reduce or eliminate light sensitivity.

* * * * *